(12) United States Patent
Kitamoto

(10) Patent No.: US 9,117,789 B2
(45) Date of Patent: Aug. 25, 2015

(54) SEMICONDUCTOR DEVICE

(75) Inventor: Ryota Kitamoto, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 794 days.

(21) Appl. No.: 13/452,932

(22) Filed: Apr. 23, 2012

(65) Prior Publication Data

US 2012/0327609 A1 Dec. 27, 2012

(30) Foreign Application Priority Data

Jun. 23, 2011 (JP) ................ 2011-139000

(51) Int. Cl.
- *H02M 7/00* (2006.01)
- *H01L 23/36* (2006.01)
- *H01L 25/07* (2006.01)
- *H01L 25/18* (2006.01)

(52) U.S. Cl.
CPC .............. *H01L 23/36* (2013.01); *H01L 25/072* (2013.01); *H01L 25/18* (2013.01); *H01L 2224/49111* (2013.01); *H01L 2924/1305* (2013.01); *H01L 2924/13055* (2013.01); *H01L 2924/13091* (2013.01); *H01L 2924/3011* (2013.01); *H01L 2924/30107* (2013.01)

(58) Field of Classification Search
CPC ............ H02M 7/537; H02M 7/53806; H02M 7/5381; H02M 7/003; H01L 2924/13055; H01L 2924/13091; H01L 23/36
USPC ........... 363/131, 132, 141, 147; 361/688, 711
See application file for complete search history.

(56) References Cited

U.S. PATENT DOCUMENTS

| | | | | |
|---|---|---|---|---|
| 6,215,679 B1* | 4/2001 | Yamane et al. | ................ | 363/132 |
| 2012/0033475 A1* | 2/2012 | Tokuyama et al. | ........... | 363/131 |
| 2013/0016548 A1* | 1/2013 | Seki | ............... | 363/131 |

FOREIGN PATENT DOCUMENTS

| | | |
|---|---|---|
| JP | 2007-116172 | 5/2007 |
| JP | 2007-142073 | 6/2007 |
| JP | 2007-181351 | 7/2007 |
| JP | 2008-294216 | 12/2008 |
| JP | 2010-016947 | 1/2010 |

OTHER PUBLICATIONS

Japanese Office Action for corresponding JP Application No. 2011-139000, Apr. 15, 2013.

* cited by examiner

*Primary Examiner* — Adolf Berhane
*Assistant Examiner* — Yemane Mehari
(74) *Attorney, Agent, or Firm* — Mori & Ward, LLP

(57) ABSTRACT

A semiconductor device includes at least one arm series circuit. The at least one arm series circuit includes an upper arm, a lower arm, an insulating substrate, a positive terminal, a negative terminal, an upper arm control terminal, a lower arm control terminal, and an insulating member. The lower arm is connected to the upper arm in series. Each of the upper arm and the lower arm includes a switching element and a diode connected in anti-parallel to the switching element. The insulating substrate is disposed on ground. The positive terminal is provided on the insulating substrate. The negative terminal is provided on the insulating substrate. The upper arm control terminal is provided on the insulating substrate. The lower arm control terminal is provided adjacent to the negative terminal on the insulating substrate.

16 Claims, 15 Drawing Sheets

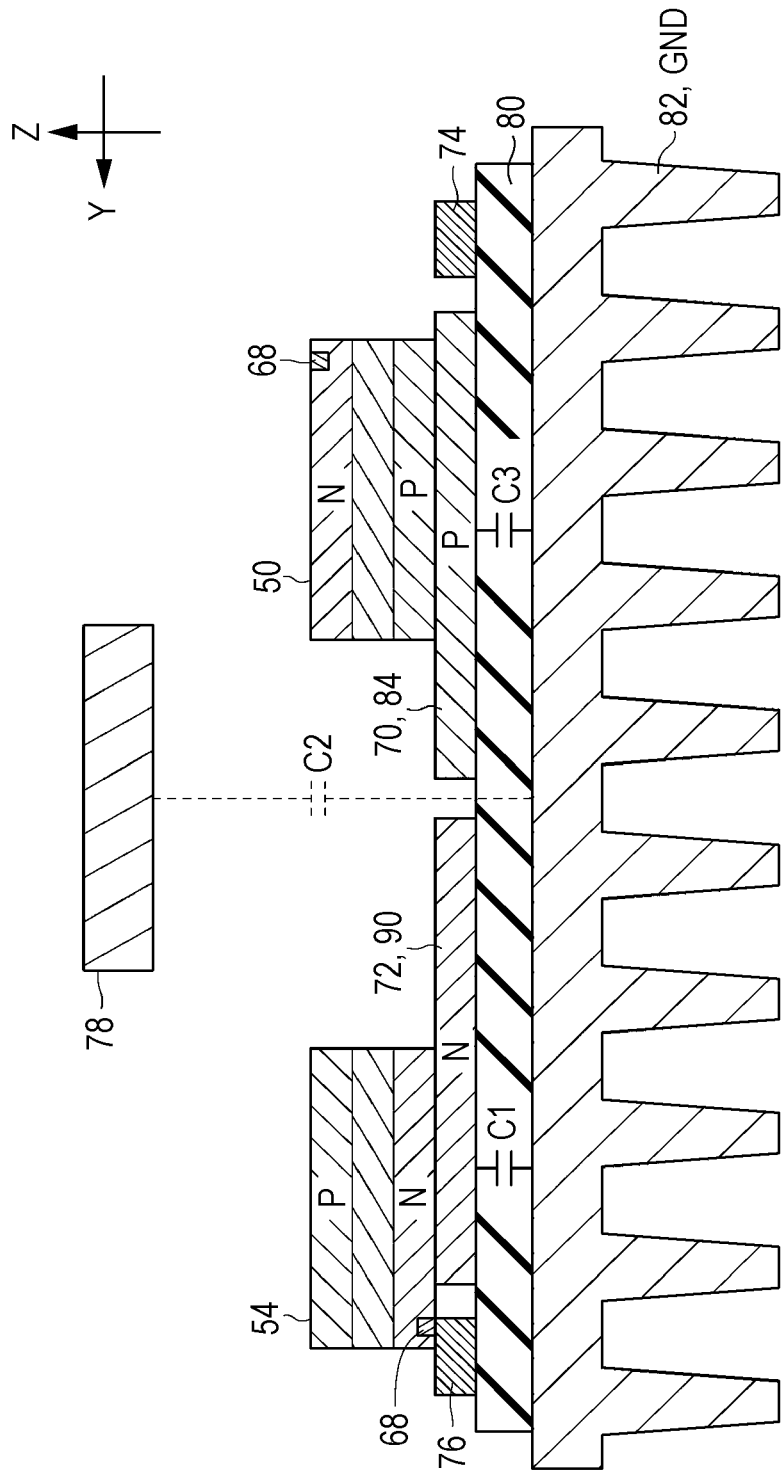

FIG. 10
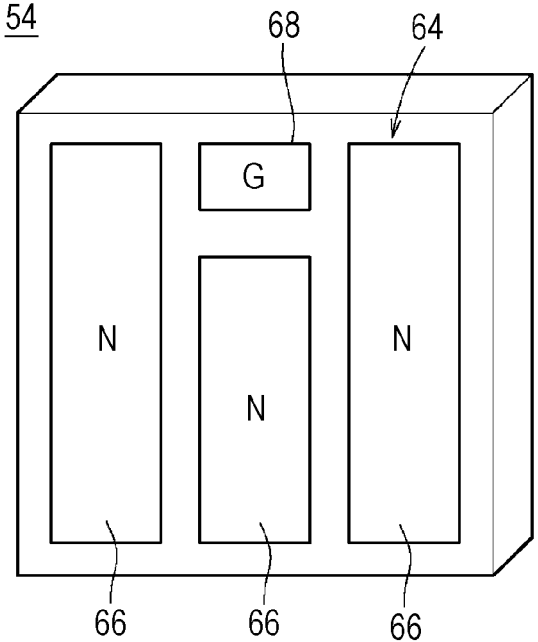
FIG. 11
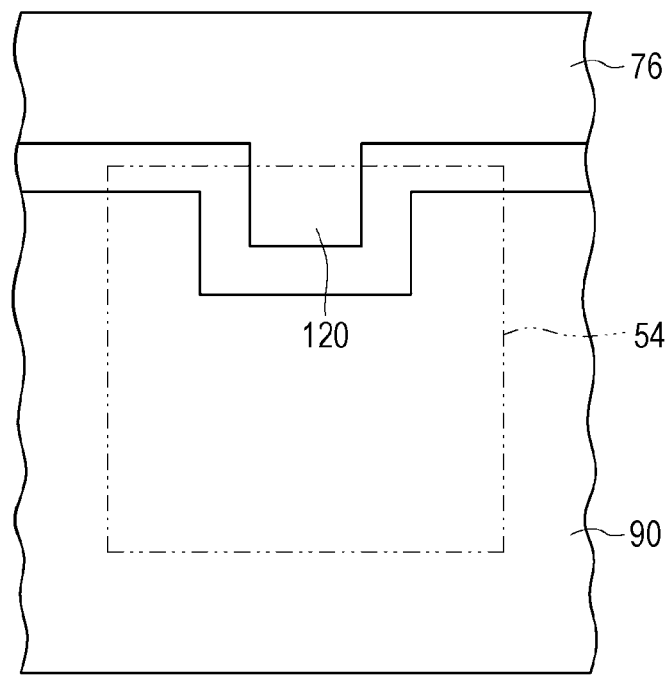
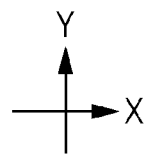

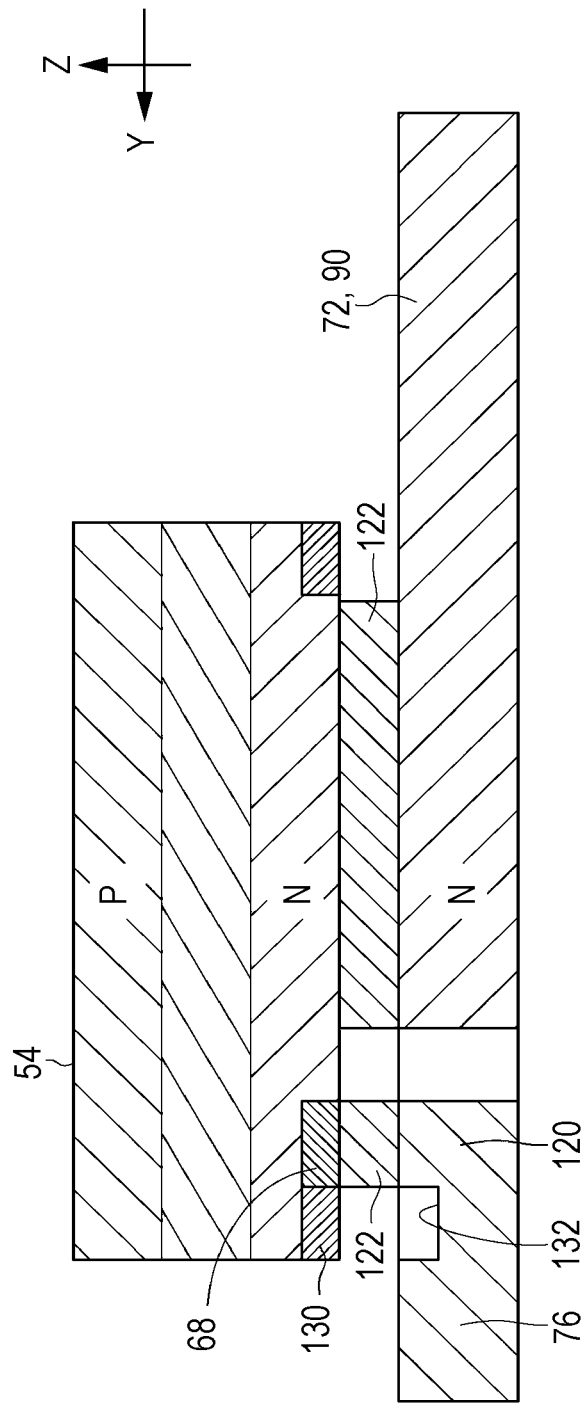

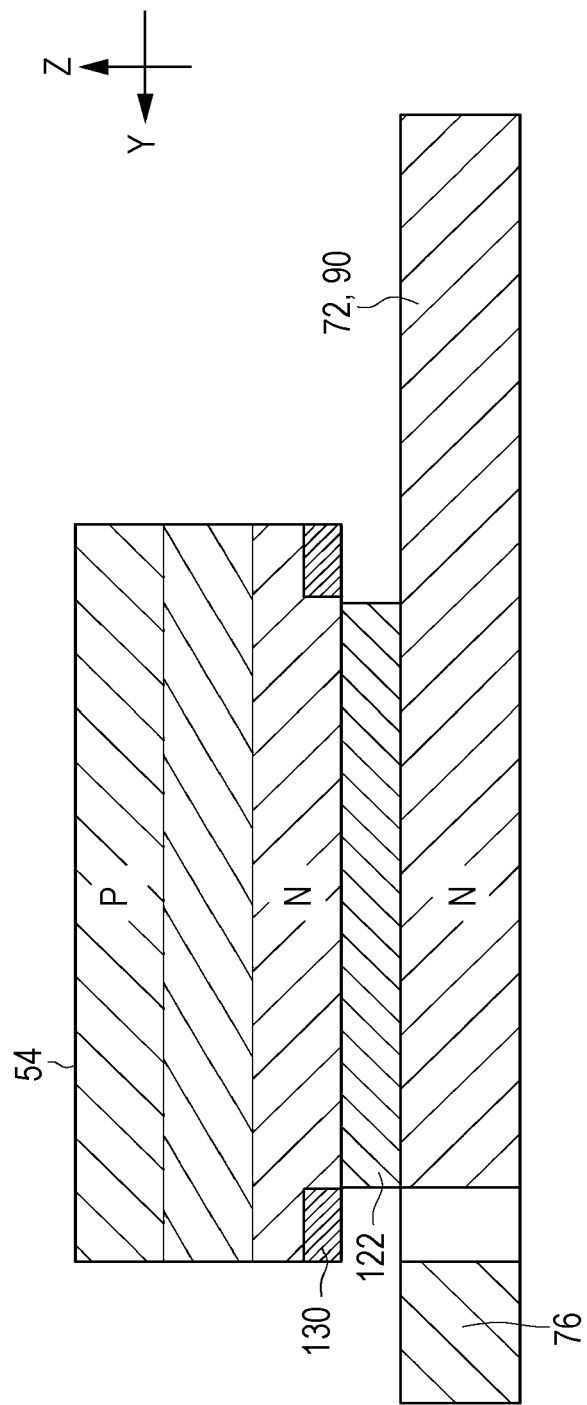

US 9,117,789 B2

SEMICONDUCTOR DEVICE

CROSS-REFERENCE TO RELATED APPLICATIONS

The present application claims priority under 35 U.S.C. §119 to Japanese Patent Application No. 2011-139000, filed Jun. 23, 2011, entitled "Semiconductor Device." The contents of this application are incorporated herein by reference in their entirety.

BACKGROUND OF THE INVENTION

1. Field of the Invention

The present technology relates to a semiconductor device.

2. Discussion of the Background

A semiconductor device including at least one arm series circuit having an upper arm and a lower arm connected to the upper arm in series, each of the upper arm and the lower arm including a switching element and a diode connected in anti-parallel to the switching element (i.e., an anti-parallel diode) has been developed. Examples of such a semiconductor device include an inverter and a converter (refer to, for example, Japanese Unexamined Patent Application Publication No. 2007-181351).

Japanese Unexamined Patent Application Publication No. 2007-181351 describes an inverter module of a power conversion apparatus capable of reducing conducted noise and radiation noise by reducing a common mode current (refer to, in particular, Abstract and a paragraph [0010]). In order to reduce conducted noise and radiation noise, an inverter module 25a of the power conversion apparatus described in Japanese Unexamined Patent Application Publication No. 2007-181351 includes a package including a single-phase (or multi-phase) switching arm series circuit having an upper arm 5 and a lower arm 6, each including a switching element and an anti-parallel diode, connected to each other in series. The inverter module 25a has a cooling copper base 1 disposed on the outer side of the package. The area of a copper pattern 4 on which the lower arm 6 of the switching arm series circuit is formed is smaller than the area of a copper pattern 3 on which the upper arm 5 of the switching arm series circuit is formed (refer to Abstract).

SUMMARY OF THE INVENTION

According to one aspect of the present invention, a semiconductor device includes at least one arm series circuit. The at least one arm series circuit includes an upper arm, a lower arm, an insulating substrate, a positive terminal, a negative terminal, an upper arm control terminal, a lower arm control terminal, and an insulating member. The lower arm is connected to the upper arm in series. Each of the upper arm and the lower arm includes a switching element and a diode connected in anti-parallel to the switching element. The insulating substrate is disposed on ground. The positive terminal is provided on the insulating substrate. The negative terminal is provided on the insulating substrate. The upper arm control terminal is provided on the insulating substrate. The lower arm control terminal is provided adjacent to the negative terminal on the insulating substrate. The output terminal is disposed above the insulating substrate. The insulating member has a convex shape and is provided on the insulating substrate between the output terminal and the insulating substrate. The switching element of each of the upper arm and the lower arm has a positive electrode, a negative electrode, and a control electrode. The positive electrode is provided on a first surface of the switching element. Each of the negative electrode and the control electrode is provided on a second surface of the switching element. The second surface is disposed on an opposite side of the first surface. The positive electrode of the switching element of the upper arm is joined to the positive terminal of the arm series circuit without using an interconnection line. The negative electrode of the switching element of the upper arm is connected to the output terminal of the arm series circuit using a negative-side interconnection line. The control electrode of the switching element of the upper arm is connected to the upper arm control terminal of the arm series circuit using a control interconnection line. The negative electrode of the switching element of the lower arm is joined to the negative terminal of the arm series circuit without using an interconnection line. The positive electrode of the switching element of the lower arm is connected to the output terminal of the arm series circuit using a positive-side interconnection line. The control electrode of the switching element of the lower arm is joined to the lower arm control terminal of the arm series circuit without using an interconnection line.

According to another aspect of the present invention, a semiconductor device includes at least one arm series circuit. The at least one arm series circuit includes an upper arm, a lower arm, an insulating substrate, a positive terminal, a negative terminal, an upper arm control terminal, a lower arm control terminal, an output terminal, and an insulating member. The lower arm is connected to the upper arm in series. Each of the upper arm and the lower arm includes a switching element and a diode connected in anti-parallel to the switching element. The insulating substrate is disposed on ground. The positive terminal is provided on the insulating substrate. The negative terminal is provided on the insulating substrate. The upper arm control terminal is provided adjacent to the positive terminal on the insulating substrate. The lower arm control terminal is provided on the insulating substrate. The output terminal is disposed above the insulating substrate. The insulating member has a convex shape and is provided on the insulating substrate between the output terminal and the insulating substrate. The switching element of each of the upper arm and the lower arm has a positive electrode, a control electrode, and a negative electrode. The control electrode is provided on a first surface of the switching element. The negative electrode is provided on a second surface of the switching element. The second surface is disposed on an opposite side of the first surface. The positive electrode of the switching element of the upper arm is joined to the positive terminal of the arm series circuit without using an interconnection line. The negative electrode of the switching element of the upper arm is connected to the output terminal of the arm series circuit using a negative-side interconnection line. The control electrode of the switching element of the upper arm is joined to the upper arm control terminal of the arm series circuit without using an interconnection line. The negative electrode of the switching element of the lower arm is joined to the negative terminal of the arm series circuit without using an interconnection line. The positive electrode of the switching element of the lower arm is connected to the output terminal of the arm series circuit using a positive-side interconnection line. The control electrode of the switching element of the lower arm is connected to the lower arm control terminal of the arm series circuit using a control interconnection line.

According to further aspect of the present invention, a semiconductor device includes at least one arm series circuit. The at least one arm series circuit includes an upper arm, a lower arm, an insulating substrate, a positive terminal, a negative terminal, an upper arm control terminal, a lower arm control terminal, an output terminal, and an insulating member. The lower arm is connected to the upper arm in series. Each of the upper arm and the lower arm includes a switching element and a diode connected in anti-parallel to the switching element. The insulating substrate is disposed on ground. The positive terminal is provided on the insulating substrate. The negative terminal is provided on the insulating substrate. The upper arm control terminal is provided on the insulating substrate. The lower arm control terminal is provided on the insulating substrate. The output terminal is disposed above the insulating substrate. The insulating member has a convex shape and is provided on the insulating substrate between the output terminal and the insulating substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 3 is a cross-sectional view taken along a line III-III of FIG. 2.

FIG. 10 is a schematic outline view of a second surface of a switching element according to a third modification.

FIG. 11 is a plan view of a first lower plate portion and a lower gate line and its vicinity (a gate lead-out portion) with a switching element according to a third modification being see-through.

FIG. 15 is a plan view of a first lower plate portion and the lower gate line and its vicinity (a gate lead-out portion) with a switching element according to the fourth modification being see-through.

FIG. 16 is a cross-sectional view taken along a line XVI-XVI of FIG. 15.

FIG. 17 is a cross-sectional view taken along a line XVII-XVII of FIG. 15.

DESCRIPTION OF THE EMBODIMENTS

Figure 1:
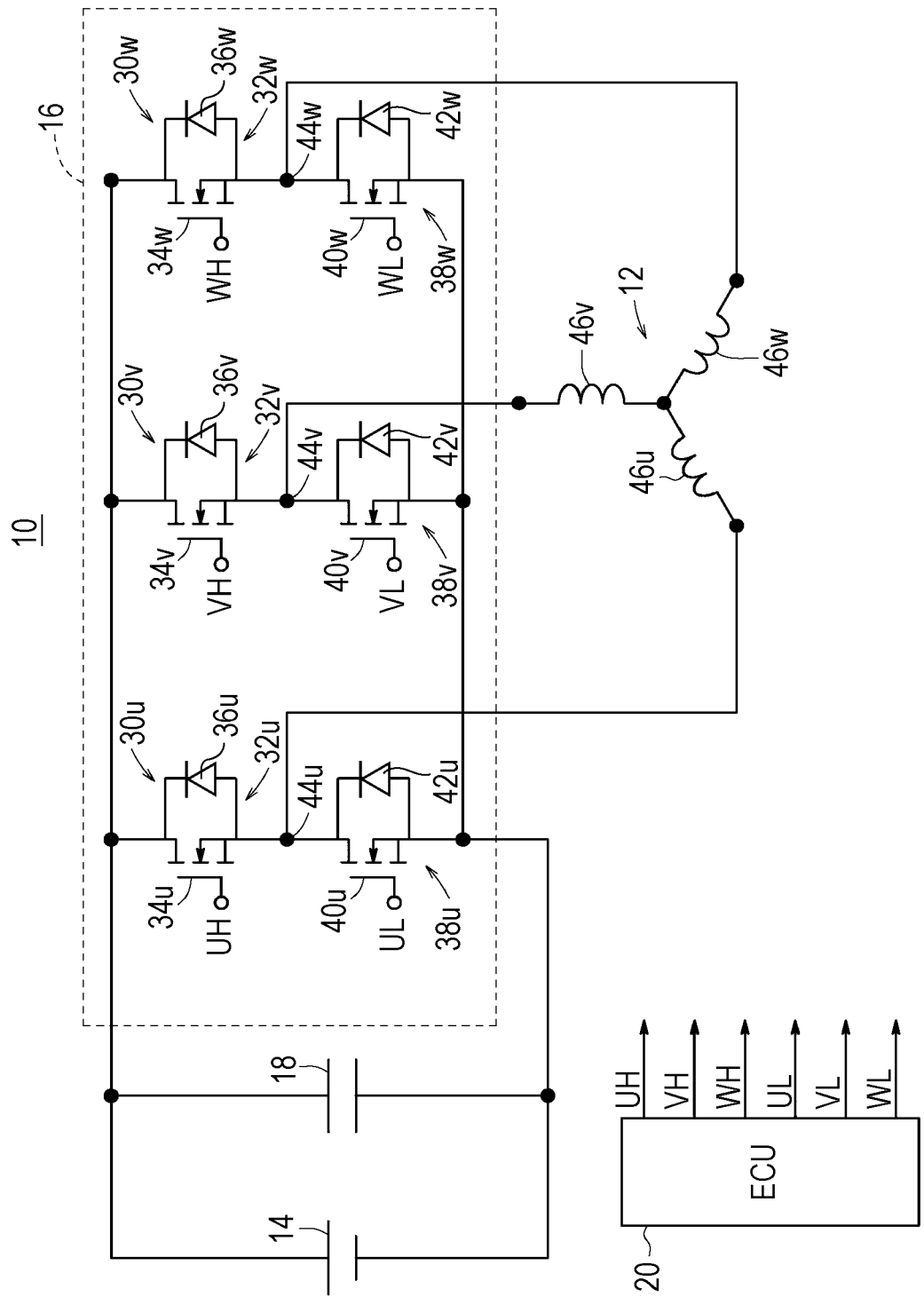
FIG. 1 is a circuit configuration diagram of a drive system having an inverter mounted thereon, the inverter serving as a semiconductor device according to an exemplary embodiment of the technology.

The embodiments will now be described with reference to the accompanying drawings, wherein like reference numerals designate corresponding or identical elements throughout the various drawings.

I. Exemplary Embodiment

A. Configurations
1. Configuration of Drive System
(1-1) Overall Configuration

FIG. 1 is a circuit configuration diagram of a drive system 10 having an inverter 16 mounted thereon, the inverter 16 serving as a semiconductor device according to the present exemplary embodiment.

As illustrated in FIG. 1, the drive system 10 includes, in addition to the inverter 16, a motor 12, a direct current power supply 14 (hereinafter also referred to as a "power supply 14"), a capacitor 18, and an electronic control unit (ECU) 20.

(1-2) Motor

The motor 12 is a three-phase brushless motor. The motor 12 receives electric power supplied from the power supply 14 via the inverter 16. The inverter 16 is controlled by the ECU 20. Thus, the motor 12 generates a driving force corresponding to the supplied electric power. For example, the motor 12 can be used as a drive motor of a vehicle or a motor of an electric power steering apparatus for generating an assist force. Alternatively, the motor 12 can be used for a different purpose later described.

(1-3) Direct Current Power Supply

The direct current power supply 14 can be a primary battery or a secondary battery that is appropriately selected in accordance with the intended use of the drive system 10. For example, if the motor 12 is used to obtain a relatively high power output (e.g., a drive motor of a vehicle), an electrical storage device (an energy storage), such as a lithium-ion secondary battery, a nickel hydrogen secondary battery, or a capacitor, can be used as the power supply 14. In contrast, if the motor 12 is used to obtain a relatively low power output (e.g., a motor of an electric power steering apparatus of a vehicle), an electrical storage device, such as a lead battery, can be used as the power supply 14.

(1-4) Inverter

The inverter 16 has a three-phase bridge configuration. The inverter 16 performs DC-to-AC conversion from a direct current output from the power supply 14 to a three-phase alternating current. Thereafter, the inverter 16 supplies the three-phase alternating current to the motor 12.

As illustrated in FIG. 1, the inverter 16 includes three-phase arm series circuits 30u, 30v, and 30w. The U-phase arm series circuit 30u includes an upper arm 32u and a lower arm 38u. The upper arm 32u includes a switching element 34u (hereinafter referred to as an "upper SW element 34u") and an anti-parallel diode 36u (hereinafter referred to as an "upper diode 36u"). The lower arm 38u includes a switching element 40u (hereinafter referred to as a "lower SW element 40u") and an anti-parallel diode 42u (hereinafter referred to as a "lower diode 42u").

Similarly, the V-phase arm series circuit 30v includes an upper arm 32v and a lower arm 38v. The upper arm 32v includes an upper switching element 34v (hereinafter referred to as an "upper SW element 34v") and an anti-parallel diode 36v (hereinafter referred to as an "upper diode 36v"). The lower arm 38v includes a lower switching element 40v (hereinafter referred to as a "lower SW element 40v") and an anti-parallel diode 42v (hereinafter referred to as a "lower diode 42v"). The W-phase arm series circuit 30w includes an upper arm 32w and a lower arm 38w. The upper arm 32w includes an upper switching element 34w (hereinafter referred to as an "upper SW element 34w") and an anti-parallel diode 36w (hereinafter referred to as an "upper diode 36w"). The lower arm 38v includes a lower switching element 40w (hereinafter referred to as a "lower SW element 40w") and an anti-parallel diode 42w (hereinafter referred to as a "lower diode 42w").

Each of the upper SW elements 34u, 34v, and 34w and the lower SW elements 40u, 40v, and 40w can be formed from, for example, one or more switching elements (e.g., metal-oxide-semiconductor field-effect transistors (MOSFETs) or insulated gate bipolar transistors (IGBTs)). According to the present exemplary embodiment, each of the upper SW elements 34u, 34v, and 34w is formed from four switching elements 50a to 50d, and each of the lower SW elements 40u, 40v, and 40w is formed from four switching elements 54a to 54d (described later in more detail). Similarly, each of the upper diodes 36u, 36v, and 36w and the lower diodes 42u, 42v, and 42w can be formed from one or more diodes. According to the present exemplary embodiment, each of the upper diodes 36u, 36v, and 36w is formed from two diodes 52a and 52b, and each of the lower diodes 42u, 42v, and 42w is formed from two diodes 56a and 56b.

Note that hereinafter, the arm series circuits 30u, 30v, and 30w are collectively referred to as "an arm series circuit 30 or arm series circuits 30". The upper arms 32u, 32v, and 32w are collectively referred to as "an upper arm 32 or upper arms 32". The lower arms 38u, 38v, and 38w are collectively referred to as "a lower arm 38 or lower arms 38". The upper SW elements 34u, 34v, and 34w are collectively referred to as "an upper SW element 34 or upper SW elements 34". The lower SW elements 40u, 40v, and 40w are collectively referred to as "a lower SW element 40 or lower SW elements 40". The upper diodes 36u, 36v, and 36w are collectively referred to as "an upper diode 36 or upper diodes 36". The lower diodes 42u, 42v, and 42w are collectively referred to as "a lower diode 42 or lower diodes 42".

In each of the arm series circuits 30, a middle point 44u between the upper arm 32u and the lower arm 38u, a middle point 44v between the upper arm 32v and the lower arm 38v, and a middle point 44w between the upper arm 32w and the lower arm 38w are connected to winding wires 46u, 46v, and 46w of the motor 12, respectively. Hereinafter, the middle points 44u, 44v, and 44w are collectively referred to as "a middle point 44 or middle points 44". The winding wires 46u, 46v, and 46w are collectively referred to as "a winding wire 46 or winding wires 46".

The upper SW elements 34 and the lower SW elements 40 are driven by drive signals UH, VH, WH, UL, VL, and WL output from the ECU 20.

(1-5) ECU

The ECU 20 controls the output of the motor 12 on the basis of the values output from a variety of sensors (not illustrated). The hardware configuration of the ECU 20 includes an input/output unit, a computing unit, and a storage unit (neither is illustrated).

2. Details of Inverter (2-1) Overall Configuration

Figure 2:
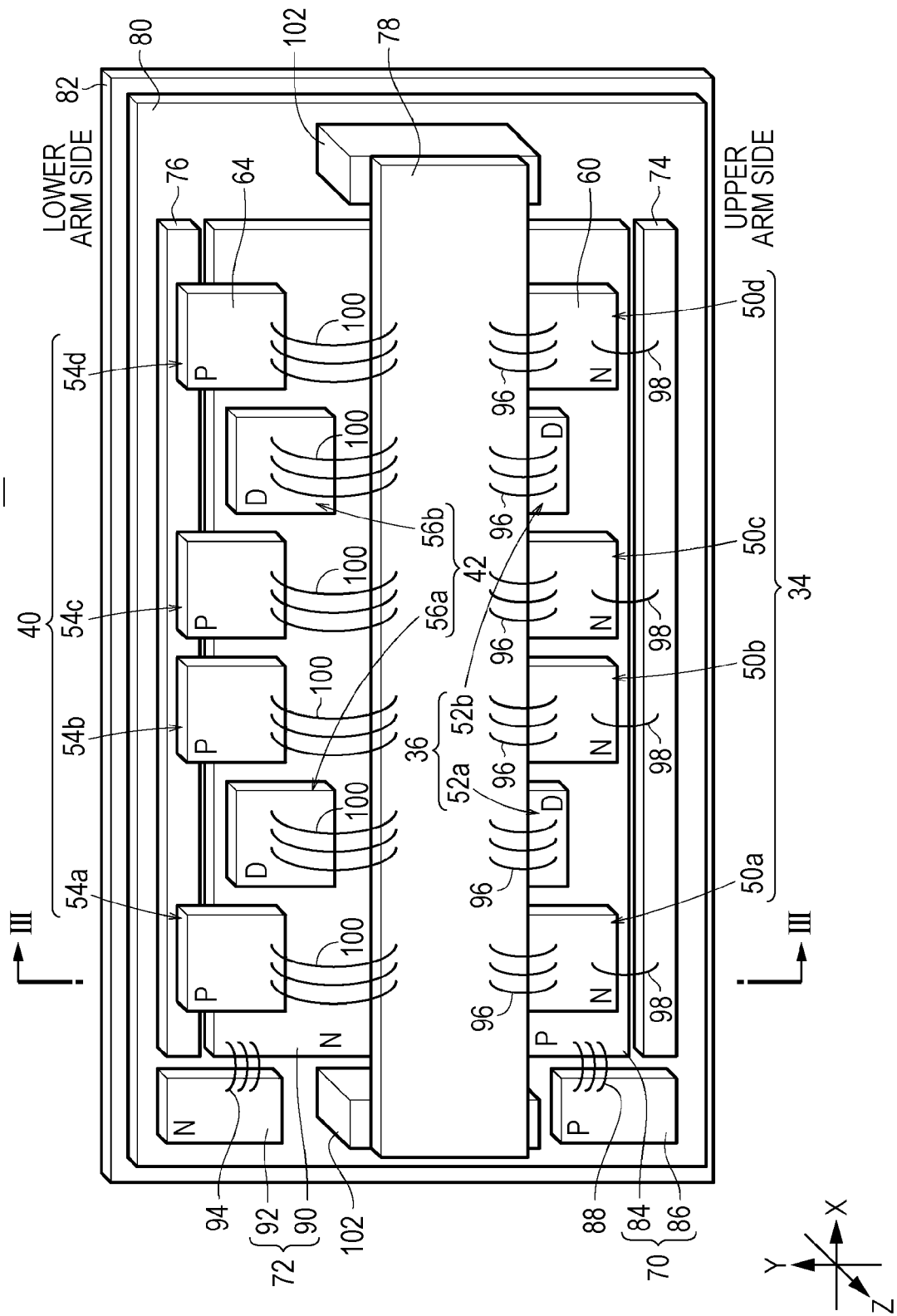
FIG. 2 is a schematic outline view of one of arm series circuits and its peripheral configuration included in the inverter.

FIG. 2 is a schematic outline view of one of the arm series circuits 30 and its peripheral configuration. FIG. 3 is a cross-sectional view taken along a line III-III of FIG. 2. According to the present exemplary embodiment, the inverter 16 is formed by using three arm series circuits 30 illustrated in FIGS. 2 and 3 arranged in parallel (refer to FIG. 1). Note that in FIG. 2, a reference symbol "P" indicates a positive side, a reference symbol "N" indicates a negative side, and a reference symbol "D" indicates a diode.

As illustrated in FIGS. 2 and 3, the arm series circuit 30 includes the switching elements 50a to 50d on the side of the upper arm 32, the diodes 52a and 52b on the side of the upper arm 32, the switching elements 54a to 54d on the side of the lower arm 38, and the diodes 56a and 56b on the side of the lower arm 38. Hereinafter, the switching elements 50a to 50d are referred to as "upper SW elements 50a to 50d", respectively. In addition, the switching elements 50a to 50d are collectively referred to as "an upper SW element 50 or upper SW elements 50". The diodes 52a and 52b are referred to as "upper diodes 52a and 52b", respectively. In addition, the diodes 52a and 52b are collectively referred to as "an upper diode 52 or upper diodes 52". The switching elements 54a to 54d are referred to as "lower SW elements 54a to 54d", respectively. In addition, the switching elements 54a to 54d are collectively referred to as "a lower SW element 54 or lower SW elements 54". The diodes 56a and 56b are referred to as "lower diodes 56a and 56b", respectively. In addition, the diodes 56a and 56b are collectively referred to as "a lower diode 56 or lower diodes 56".

As described above, the upper SW elements 50a to 50d form each of the upper SW elements 34 in the circuit diagram illustrated in FIG. 1. Accordingly, the upper SW elements 34 are also referred to as an "upper switching element unit 34". In addition, the upper diodes 52a and 52b form each of the upper diodes 36 in the circuit diagram illustrated in FIG. 1. Accordingly, the upper diodes 36 are also referred to as an "upper diode unit 36". Furthermore, the lower switching elements 54a to 54d form each of the lower SW elements 40 in the circuit diagram illustrated in FIG. 1. Accordingly, the lower SW elements 40 are also referred to as a "lower switching element unit 40". Still furthermore, the lower diodes 56a and 56b form each of the lower diodes 42 in the circuit diagram illustrated in FIG. 1. Accordingly, the lower diodes 42 are also referred to as a "lower diode unit 42".

In this way, a plurality of components (the upper SW elements 50a to 50d, the upper diodes 52a and 52b, the lower switching elements 54a to 54d, and the lower diodes 56a and 56b) illustrated in FIG. 2 are used for components illustrated in FIG. 1 (the upper SW element 34, the upper diode 36, the lower SW element 40, and the lower diode 42 respectively), and therefore a large amount of current can flow through the arm series circuit 30. Note that the number of the upper SW elements 50a to 50d, the number of the upper diodes 52a and 52b, the number of the lower switching elements 54a to 54d, and the number of the lower diodes 56a and 56b are not limited to the above-described numbers. Any number greater than or equal to one can be employed in accordance with the specification.

Figure 4A:
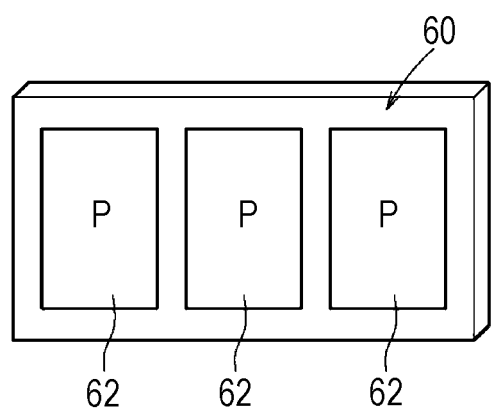
FIG. 4A is a schematic outline view of a first surface of a switching element.
Figure 4B:
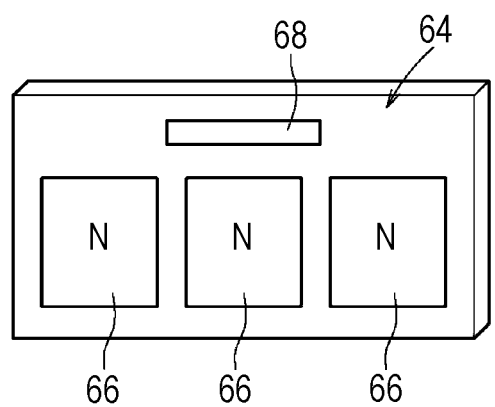
FIG. 4B is a schematic outline view of a second surface of the switching element.

According to the present exemplary embodiment, switching elements (e.g., MOSFETs or IGBTs) having the same specification are used as the upper SW elements 50 and the lower SW elements 54. In addition, according to the present exemplary embodiment, as illustrated in FIGS. 4A and 4B, each of the upper SW elements 50 and the lower SW elements 54 includes a plurality of positive electrodes 62 formed on a first surface 60 (a drain surface) and a plurality of negative electrodes 66 and a gate electrode 68 (a control electrode) formed on a second surface 64 (a source surface) that is opposite the first surface 60. Note that a reference symbol "P" in FIG. 4A indicates a positive side, and a reference symbol "N" in FIG. 4B indicates a negative side. The plurality of positive electrodes 62 and the plurality of negative electrodes 66 are provided so that a large amount of current is allowed to flow. One, two, or four or more positive electrodes 62 and one, two, or four or more negative electrodes 66 may be provided in accordance with the specification.

Hereinafter, in order to discriminate the components of the upper SW elements 50 from the components of the lower SW elements 54, the positive electrode 62, the negative electrode 66, and the gate electrode 68 of the upper SW element 50 are referred to as an "upper positive electrode 62up", an "upper negative electrode 66up", and an "upper gate electrode 68up", respectively. In addition, the positive electrode 62, the negative electrode 66, and the gate electrode 68 of the lower SW element 54 are referred to as a "lower positive electrode 62low", a lower negative electrode 66low, and a "lower gate electrode 68low", respectively. Note that in FIG. 2, the positive electrodes 62, the negative electrodes 66, and the gate electrode 68 are not illustrated.

As illustrated in FIGS. 2 and 3, a positive terminal 70, a negative terminal 72, an upper gate line 74 (an upper arm control terminal), a lower gate line 76 (a lower arm control terminal), and an output terminal 78 of the inverter 16 are disposed around the arm series circuit 30. The positive terminal 70, the negative terminal 72, the upper gate line 74, and the lower gate line 76 are formed on an insulating substrate 80. The insulating substrate 80 is a plate-like member formed on a heat sink 82. For example, the insulating substrate 80 is made of ceramic. The heat sink 82 cools the inverter 16. The heat sink 82 is connected to ground GND.

The positive terminal 70 includes a first upper plate portion 84 having the upper SW elements 50 formed thereon and a second upper plate portion 86 connected to the first upper plate portion 84 using a bonding wire 88. The second upper plate portion 86 is connected to a positive terminal of the power supply 14 (refer to FIG. 1). The negative terminal 72 includes a first lower plate portion 90 having the lower SW elements 54 formed thereon and a second lower plate portion 92 connected to the first lower plate portion 90 using a bonding wire 94. The second lower plate portion 92 is connected to a negative terminal of the power supply 14 (refer to FIG. 1).

As illustrated in FIG. 2, the first upper plate portion 84, the first lower plate portion 90, the upper gate line 74, and the lower gate line 76 have a plate-like shape with the same length (in the X direction in FIG. 2). In addition, when viewed in the layer direction of the arm series circuit 30 (in the Z direction in FIG. 2), the upper gate line 74, the first upper plate portion 84, the output terminal 78, the first lower plate portion 90, and the lower gate line 76 are sequentially arranged in the width direction (in the Y direction in FIG. 2).

The first upper plate portion 84, the second upper plate portion 86, the first lower plate portion 90, and the second lower plate portion 92 are directly formed on a surface of the insulating substrate 80 using a direct bonding copper (DBC) process. In addition, a copper solid pattern (not illustrated) is formed using a DBC process on another surface of the insulating substrate 80 on the heat sink 82 side.

In addition, solder paste, a copper plate, and thermal grease (neither is shown) are disposed between the solid pattern and the heat sink 82. That is, the solid pattern is joined to the copper plate with the solder paste therebetween. The copper plate is joined to the heat sink 82 with the thermal grease therebetween.

(2-2) Upper Arm

The positive electrode 62 (the upper positive electrode 62up) of each of the upper SW elements 50 is joined to the positive terminal 70 (the first upper plate portion 84) of the inverter 16 using solder paste (not illustrated) (refer to FIG. 3). Instead of using solder paste, the positive electrode 62 may be joined to the positive terminal 70 using brazing. A wire (an interconnection line member), such as a bonding wire or a bus bar, is not used to join the upper positive electrode 62up to the positive terminal 70.

The negative electrode 66 (the upper negative electrode 66up) of each of the upper SW elements 50 is connected to the output terminal 78 of the inverter 16 using a bonding wire 96 (a negative side interconnection line). Note that, in FIG. 2, three bonding wires 96 are formed on each of the upper SW elements 50, because three negative electrodes 66 are formed on the upper SW element 50 (refer to FIG. 4B).

The gate electrode 68 (the upper gate electrode 68up) of each of the upper SW elements 50 is connected to the upper gate line 74 using a bonding wire 98 (a control interconnection line). The upper gate line 74 is connected to the ECU 20. Accordingly, the same drive signal is supplied to all of the upper gate electrodes 68up and, therefore, the upper SW elements 50 perform the same on-off operation. Note that the upper gate line 74 may be provided for each of the upper gate electrodes 68up or for every two upper gate electrodes 68up.

(2-3) Lower Arm

The negative electrode 66 (the lower negative electrode 66low) of each of the lower SW elements 54 is connected to the negative terminal 72 (the first lower plate portion 90) of the inverter 16 using solder paste (not illustrated) (refer to FIG. 3). Instead of using solder paste, the negative electrodes 66 may be connected to the negative terminal 72 using brazing. A wire (an interconnection line member), such as a bonding wire or a bus bar, is not used to join the lower negative electrode 66low to the negative terminal 72.

The positive electrode 62 (the lower positive electrode 62low) of each of the lower SW elements 54 is connected to the output terminal 78 of the inverter 16 using a bonding wire 100 (a positive-side interconnection line).

The gate electrode 68 (the lower gate electrode 68low) of each of the lower SW elements 54 is connected to the lower gate line 76 using solder paste (not illustrated). The lower gate line 76 is connected to the ECU 20. Instead of using solder paste, the gate electrodes 68 may be connected to the lower gate line 76 using brazing. A wire (an interconnection line member), such as a bonding wire or a bus bar, is not used to join the gate electrode 68 to the lower gate line 76. That is, according to the present exemplary embodiment, as illustrated in FIG. 4B, the lower negative electrode 66low and the gate electrode 68 are formed on the same surface (on the second surface 64). As illustrated in FIGS. 2 and 3, the negative terminal 72 and the lower gate line 76 are disposed so as to be adjacent to each other. Accordingly, the lower negative electrode 66low can be connected to the negative terminal 72 without using an interconnection line. In addition, the lower gate electrode 68low can be connected to the lower gate line 76 without using an interconnection line. Furthermore, since the lower gate electrodes 68low are connected to the same lower gate line 76, the same drive signal is supplied from the ECU 20 to the lower gate electrodes 68low. Thus, the lower SW elements 54 perform the same on-off operation. Note that the lower gate line 76 can be provided for each of the lower gate electrodes 68low or for every two lower gate electrodes 68low.

(2-4) Output Terminal

As illustrated in FIG. 2, the output terminal 78 is disposed so as to be separated from the insulating substrate 80 by insulating poles 102 (convex insulating members) formed on the insulating substrate 80. The insulating poles 102 are formed from insulating members, such as silicon dioxide layers. The material of the insulating poles 102 may be the same as the material of the insulating substrate 80. Alternatively, the material of the insulating poles 102 may differ from the material of the insulating substrate 80. In addition, when viewed in the layer direction of the arm series circuit 30 (in the Z direction in FIG. 2), the insulating poles 102 are disposed at both ends of the first upper plate portion 84 of the positive terminal 70 and the first lower plate portion 90 of the negative terminal 72. In this way, when viewed in the layer direction (in the Z direction in FIG. 2), the output terminal 78 is disposed between the first upper plate portion 84 of the positive terminal 70 and the first lower plate portion 90 of the negative terminal 72.

B. Floating Capacitance

Figure 5:
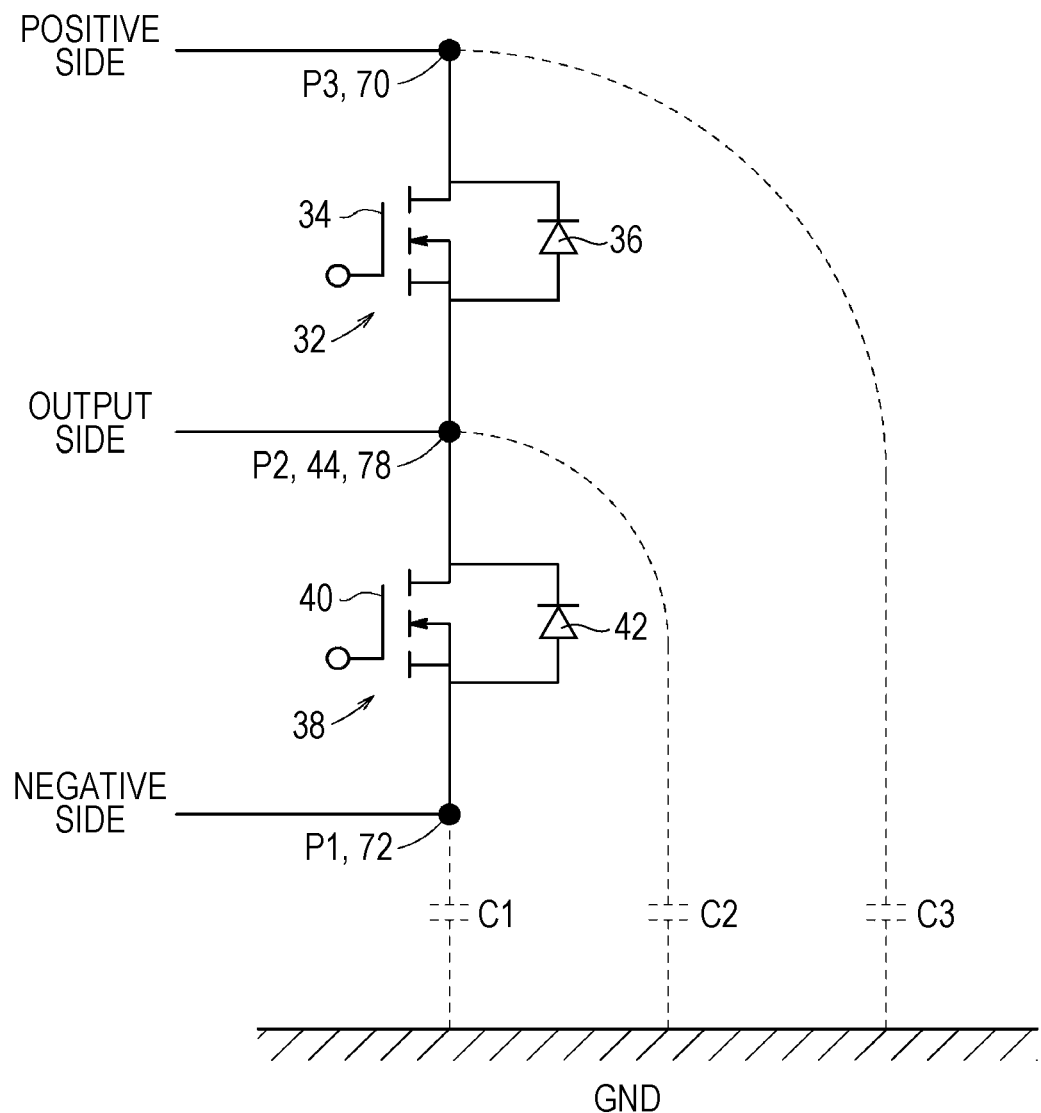
FIG. 5 is a circuit diagram illustrating floating capacitances generated at a plurality of points of the arm series circuit.

FIG. 5 is a circuit diagram illustrating floating capacitances C1 to C3 at a plurality of points P1 to P3 of one of the arm series circuits 30. The floating capacitances C1 to C3 at points P1 to P3, respectively, are described below with reference to FIGS. 3 and 5.

If one of the arm series circuits 30 operates, the floating capacitances C1 to C3 may be generated between each of the points P1 to P3 and the ground GND (the heat sink 82). The presence of the floating capacitances C1 to C3 may allow noise to transfer to the common side (toward the power supply 14 or other apparatuses) via the ground GND (the heat sink 82) when the upper SW element 50 and the lower SW element 54 perform a switching operation and, therefore, conducted noise and radiation noise may be generated. The mechanism of conducted noise generation and radiation noise generation is described in, for example, paragraphs [0008] and [0009] of Japanese Unexamined Patent Application Publication No. 2007-181351, the entire content of which are incorporated herein by reference.

In general, an impedance Xc of a capacitor is obtained as follows:

$$Xc=1/(j\omega C) \quad (1)$$

In equation (1), j denotes an imaginary unit, $\omega$ denotes the angular frequency [Hz], and C denotes the electrostatic capacitance [F].

As can be seen from equation (1), in the arm series circuit 30, an electrical current more easily flows through the floating capacitances C1 to C3 with an increase in the switching frequency [Hz] of the upper SW element 50 and the lower SW element 54. However, by decreasing the capacitance value C, the amount of an electrical current flowing through the floating capacitances C1 to C3 can be decreased. In particular, since the effect of a common mode current Icom that flows from the floating capacitance C2 generated between the point P2 (the output terminal 78 that represents a middle point 44) at which an electrical potential varies due to switching and the ground GND (the heat sink 82) is large, it is desirable to increase the impedance of the floating capacitance C2.

Furthermore, in general, the electrostatic capacitance C [F] between two parallel flat plates (electrode plates) can be expressed as follows:

$$C=\epsilon 0 \cdot \epsilon s \cdot (S/d) \quad (2)$$

In equation (2), $\epsilon 0$ denotes the dielectric constant of vacuum [F/m], $\epsilon S$ denotes the relative permittivity, S denotes the area of the electrode plate [m$^2$], and d denotes the distance between the parallel flat plates (electrode plates) [m]. As can be seen from equation (2), the electrostatic capacitance C decreases with an increase in the distance d between the parallel flat plates (electrode plates).

As compared with the case in which the output terminal 78 is formed on the insulating substrate 80, according to the present exemplary embodiment, the output terminal 78 is disposed above the insulating substrate 80 with the insulating poles 102 disposed therebetween so as to be separated from the insulating substrate 80 and the ground GND (the heat sink 82). Accordingly, the distance between the output terminal 78 and the ground GND (the heat sink 82) (i.e., the distance d) is increased. Therefore, according to equation (2), the floating capacitance C2 is relatively decreased. In addition, as can be seen from equation (1), if the floating capacitance C2 is relatively decreased, the impedance Xc is relatively increased. As a result, the common mode current Icom can be decreased and, therefore, conducted noise and radiation noise caused by the common mode current Icom can be reduced.

C. Advantage of Exemplary Embodiment

As described above, according to the present exemplary embodiment, conducted noise and radiation noise caused by the common mode current Icom can be reduced. In addition, the gate electrode 68 (the lower gate electrode 68low) of each of the lower SW elements 40 can be easily connected to the lower gate line 76 of the arm series circuit 30.

That is, according to the present exemplary embodiment, since the output terminal 78 of the arm series circuit 30 is disposed above the insulating substrate with the insulating poles 102 formed on the insulating substrate 80 disposed therebetween, the output terminal 78 can be separated from the insulating substrate 80 and the heat sink 82 (the ground GND) by the height of the insulating poles 102. Accordingly, the floating capacitance C2 generated between the output terminal 78 and the ground GND can be decreased. In this way, the impedance between the output terminal 78 at which a voltage variation is relatively significant and the ground GND can be increased. Thus, the amount of electrical current that flows between the output terminal 78 and the ground GND due to a variation in the voltage can be reduced. Accordingly, the common mode current Icom that flows toward the power supply or the output side can be reduced. As a result, conducted noise and radiation noise caused by the common mode current Icom can be reduced.

In addition, according to the present exemplary embodiment, the gate electrode 68 (the lower gate electrode 68low) of the lower SW element 40 is joined to the lower gate line 76 without using an interconnection line. Accordingly, even when the lower gate electrode 68low is formed on the same side as the lower negative electrode 66low (i.e., on the second surface 64) and, thus, the lower negative electrode 66low is joined to the negative terminal 72 without using an interconnection line, the lower gate electrode 68low can be easily connected to the lower gate line 76.

According to the present exemplary embodiment, when viewed in the layer direction of the arm series circuit 30 (in the Z direction in FIGS. 2 and 3), the position of the negative electrode 66 (the upper negative electrode 66up) of the upper SW element 34 and the position of the positive electrode 62 (the lower positive electrode 62low) of the lower SW element 40 are offset from the position of the output terminal 78.

Therefore, as compared with the case in which when viewed from the layer direction, the position of the upper negative electrode 66up and the position of the lower positive electrode 62low are not offset from the position of the output terminal 78 (i.e., the case in which when viewed in the layer direction, most of the upper negative electrode 66up or most of the lower positive electrode 62low is hidden under the output terminal 78), the bonding wire 96 can be easily provided between the upper negative electrode 66up and the output terminal 78. In addition, the bonding wire 100 can be easily provided between the lower positive electrode 62low and the output terminal 78.

According to the present exemplary embodiment, when viewed in the layer direction of the arm series circuit 30 (in the Z direction in FIGS. 2 and 3), the output terminal 78 of the arm series circuit 30 is disposed at the middle point between the positive terminal 70 and the negative terminal 72. In this way, the length of an interconnection line extending between the upper SW element 34 and the output terminal 78 can be easily made the same as the length of an interconnection line extending between the lower SW element 40 and the output terminal 78. Thus, a difference between the inductance components of the bonding wire 96 and the bonding wire 100 can be reduced. As a result, the occurrence of conducted noise and radiation noise can be reduced.

II. Modifications

Note that it should not be construed that the technical scope of the application is limited to the above-described embodiments. A variety of configurations can be made from the description described herein. For example, the following configurations can be employed.

A. Inverter and Drive System

Figure 6:
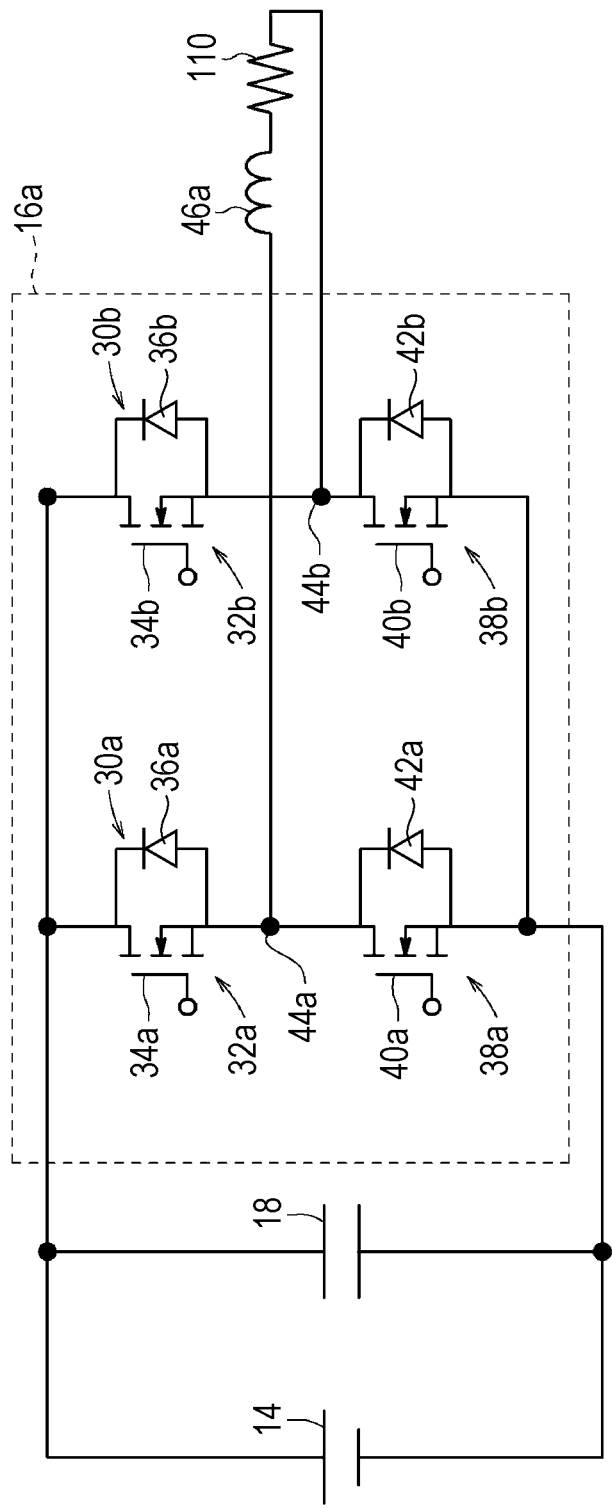
FIG. 6 is a circuit diagram of a circuit having an inverter that is mounted thereon and that serves as a semiconductor device according to a first modification.

While the above embodiment has been described with reference to the three-phase bridge inverter 16, any inverter that includes a single-phase or multi-phase arm series circuit having an upper arm and a lower arm connected in series, each including a switching element and an anti-parallel diode, can be employed. For example, as illustrated in FIG. 6, the present technology is applicable to a single-phase bridge inverter 16*a*. As illustrated in FIG. 6, the inverter 16*a* converts a direct current output from the power supply 14 into an alternating current and supplies the alternating current to a winding wire 46*a* (the load) and a resistor 110.

The inverter 16*a* includes two arm series circuits 30*a* and 30*b*. The arm series circuit 30*a* includes an upper arm 32*a* and a lower arm 38*a*. The upper arm 32*a* includes a switching element 34*a* (hereinafter referred to as an "upper SW element 34*a*") and an anti-parallel diode 36*a* (hereinafter referred to as an "upper diode 36*a*"). The lower arm 38*a* includes a switching element 40*a* (hereinafter referred to as a "lower SW element 40*a*") and an anti-parallel diode 42*a* (hereinafter referred to as a "lower diode 42*a*"). Similarly, the arm series circuit 30*b* includes an upper arm 32*b* and a lower arm 38*b*. The upper arm 32*b* includes a switching element 34*b* (hereinafter referred to as an "upper SW element 34*b*") and an anti-parallel diode 36*b* (hereinafter referred to as an "upper diode 36*b*"). The lower arm 38*b* includes a switching element 40*b* (hereinafter referred to as a "lower SW element 40*b*") and an anti-parallel diode 42*b* (hereinafter referred to as a "lower diode 42*b*").

In the inverter 16*a*, also, the output terminal, which is located at a middle point 44*a* between the upper arm 32*a* and the lower arm 38*a* and at a middle point 44*b* between the upper arm 32*b* and the lower arm 38*b*, is separated from the ground GND (the heat sink) using an insulating pole, and the floating capacitance C2 generated at the middle points 44*a* and 44*b* can be reduced. Thus, conducted noise and radiation noise can be reduced.

While the above exemplary embodiment and the modification illustrated in FIG. 6 have been described with reference to the case in which the present technology is applied to the inverters 16 and 16*a*, the present technology is applicable to any semiconductor device that includes a single-phase or multi-phase arm series circuit in which an upper arm and a lower arm, each having a switching element and an anti-parallel diode, are connected in series. For example, the technology is applicable to a buck-boost chopper DC/DC converter. The buck-boost chopper DC/DC converter is described in, for example, FIGS. 1 and 9 of Japanese Unexamined Patent Application Publication No. 2009-153343, the entire contents of which are incorporated herein by reference.

While the above exemplary embodiment has been described with reference to four upper SW elements 50*a* to 50*d* corresponding to one of the upper SW elements 34 of the circuit illustrated in FIG. 1 and four lower switching elements 54*a* to 54*d* corresponding to one of the lower SW elements 40 of the circuit illustrated in FIG. 1 (refer to FIG. 2), the number of the upper SW elements 50 and the number of the lower SW elements 54 can be one or more in accordance with the specification. Similarly, while the above exemplary embodiment has been described with reference to two upper diodes 52*a* and 52*b* corresponding to the upper diode 36 of the circuit illustrated in FIG. 1 and two lower diodes 56*a* and 56*b* corresponding to the lower diode 42 of the circuit illustrated in FIG. 1 (refer to FIG. 2), the number of the upper diodes 52 and the number of the lower diodes 56 can be one or more in accordance with the specification.

While the above exemplary embodiment has been described with reference to the motor 12 of the drive system 10 used for driving a vehicle or for electric power steering, the present technology is applicable to any configuration in which the floating capacitance C2 is generated at the middle point 44 between the upper arm 32 and the lower arm 38. For example, the present technology is applicable to a motor used in a laundry machine, a cleaner, an air conditioner, a refrigerator, an induction cooker, an alternating current (AC) servo, a railway vehicle, or an elevator.

While the above exemplary embodiment has been described with reference to the drive system 10 for driving the motor 12, the present technology is applicable to any configuration in which the floating capacitance C2 is generated at the middle point 44 between the upper arm 32 and the lower arm 38. For example, the drive system 10 is applicable to an inverter used in an uninterruptible power supply system or a power conditioner for solar power generation or wind power generation. The inverter used in an uninterruptible power supply system or a power conditioner for solar power generation or wind power generation is described in, for example, FIG. 4 of Japanese Unexamined Patent Application Publication No. 2011-103497, the entire contents of which are incorporated herein by reference.

B. Gate Electrode and Junction Structure Between Gate Lines

While the above exemplary embodiment has been described with reference to the gate electrode 68 of each of the upper SW elements 50 and the lower SW elements 54 formed on a surface that is the same as the surface having the negative electrodes 66 formed thereon (i.e., the second surface 64) (refer to FIG. 4B), the location of the gate electrode 68 is not limited thereto. For example, as illustrated in FIGS. 7A and 7B, the gate electrode 68 can be formed on a surface that is the same as the surface having the positive electrodes 62 formed thereon (i.e., the first surface 60) instead of forming the gate electrode 68 on the surface having the negative electrodes 66 formed thereon (i.e., the second surface 64).

Figure 7A:
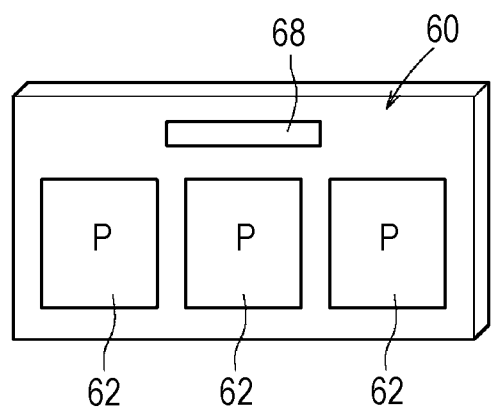
FIG. 7A is a schematic outline view of a first surface of a switching element according to a second modification.
Figure 7B:
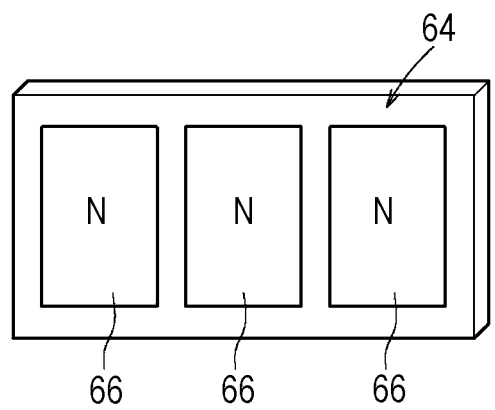
FIG. 7B is a schematic outline view of a second surface of the switching element according to the second modification.
Figure 8:
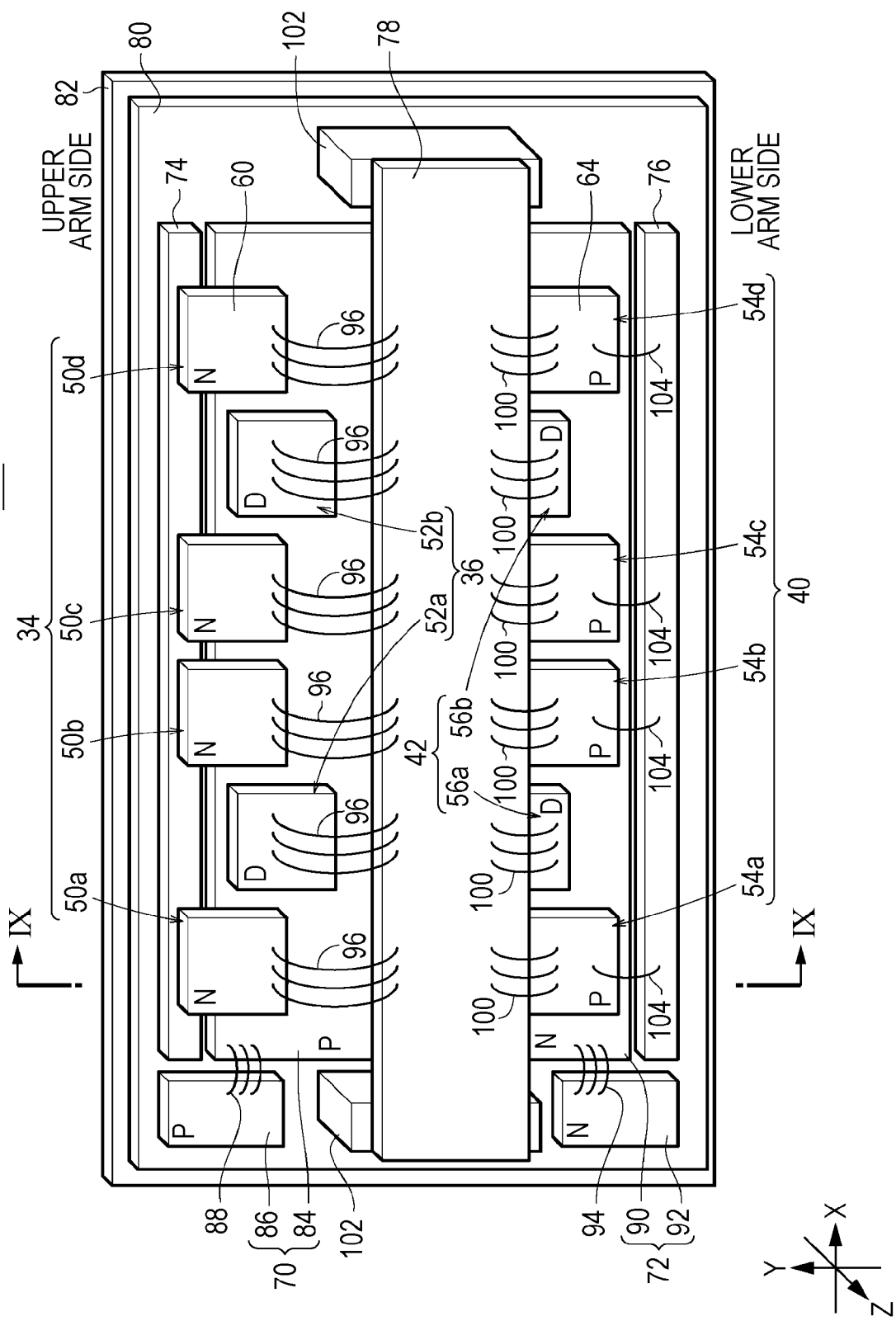
FIG. 8 is a schematic outline view of an arm series circuit including the switching elements illustrated in FIGS. 7A and 7B and its peripheral configuration.
Figure 9:
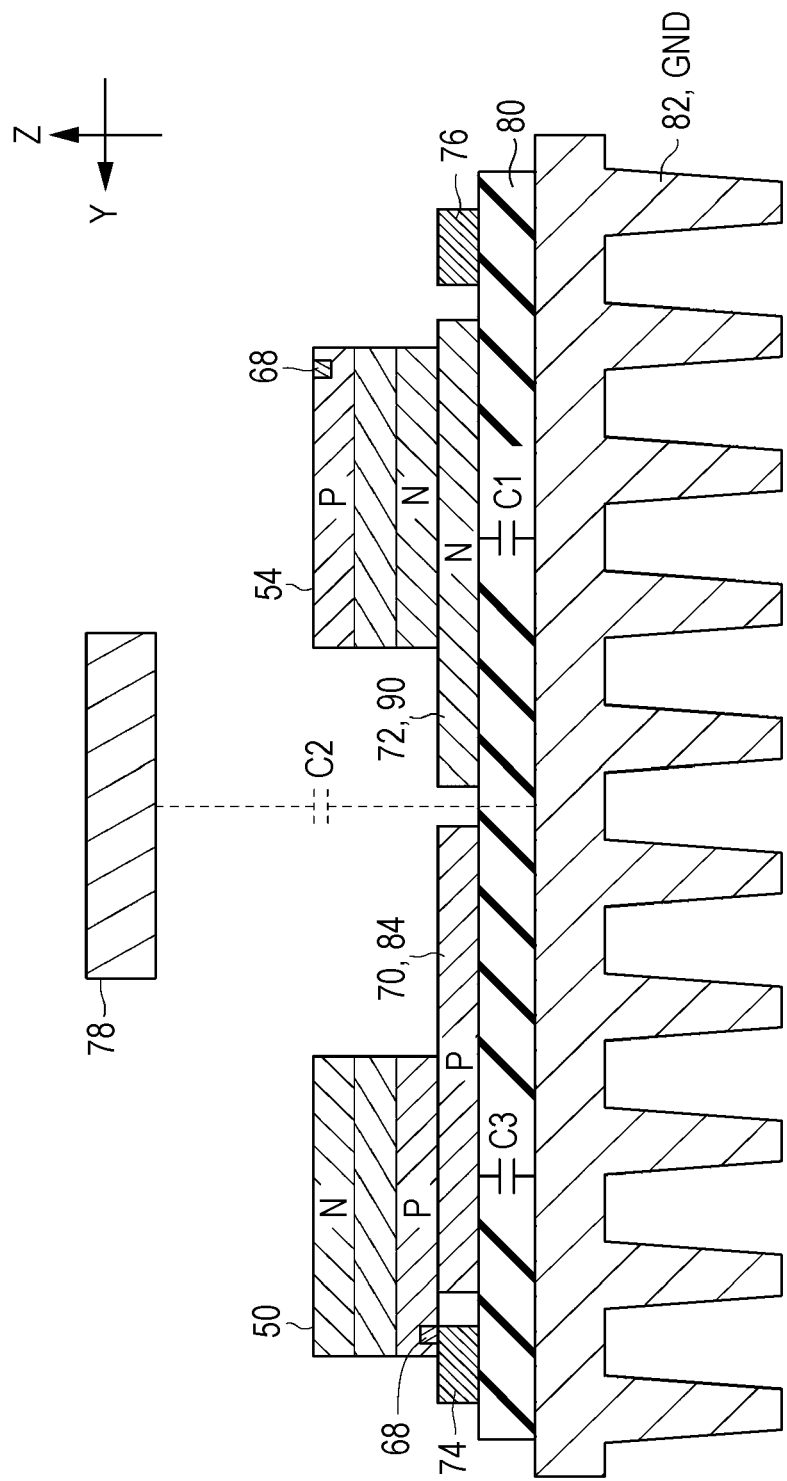
FIG. 9 is a cross-sectional view taken along a line IX-IX of FIG. 8.

FIG. 8 is a schematic outline view of the arm series circuit 30*a* including the upper SW elements 50 and the lower SW elements 54 illustrated in FIGS. 7A and 7B and its peripheral configuration. FIG. 9 is a cross-sectional view taken along a line IX-IX of FIG. 8. As illustrated in FIGS. 8 and 9, in the arm series circuit 30*a*, the gate electrode 68 (the upper gate electrode 68up) of the upper SW element 50 is joined to the upper gate line 74 using solder paste (not illustrated). At that time, an interconnection line, such as a bonding wire or a bus bar, is not used. Instead, the gate electrode 68 (the lower gate electrode 68low) of the lower SW element 54 is connected to the lower gate line 76 using a bonding wire 104 (a control interconnection line).

According to the structure illustrated in FIGS. 8 and 9, an operation and an advantage that are similar to those of the above-described exemplary embodiment can be provided. That is, conducted noise and radiation noise caused by the common mode current Icom can be reduced. In addition, the gate electrode 68 (the upper gate electrode 68up) of the upper SW element 50 can be easily connected to the upper gate line 74 of the arm series circuit 30a.

Alternatively, as illustrated in FIG. 10, switching elements (the upper SW elements 50 and the lower SW elements 54) may have such a structure that the gate electrode 68 is surrounded by the negative electrodes 66 on the second surface 64 in three directions. In this case, the first surface 60 is similar to that of FIG. 4A.

Figure 12:
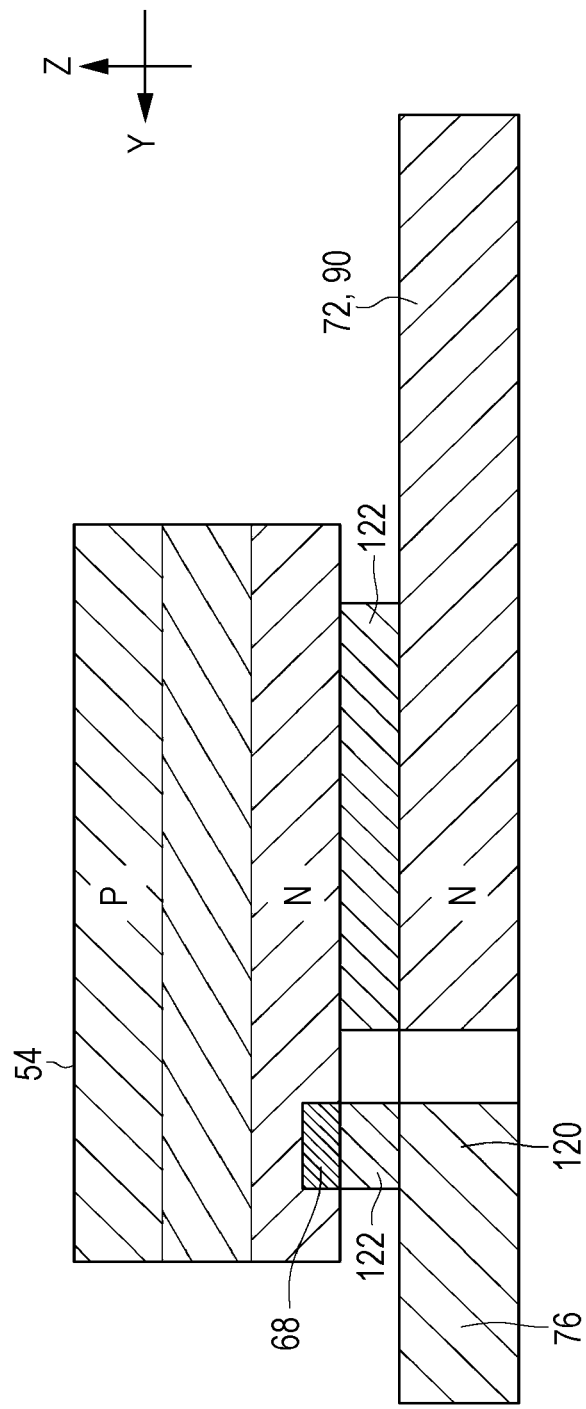
FIG. 12 is a cross-sectional view taken along a line XII-XII of FIG. 11.
Figure 13:
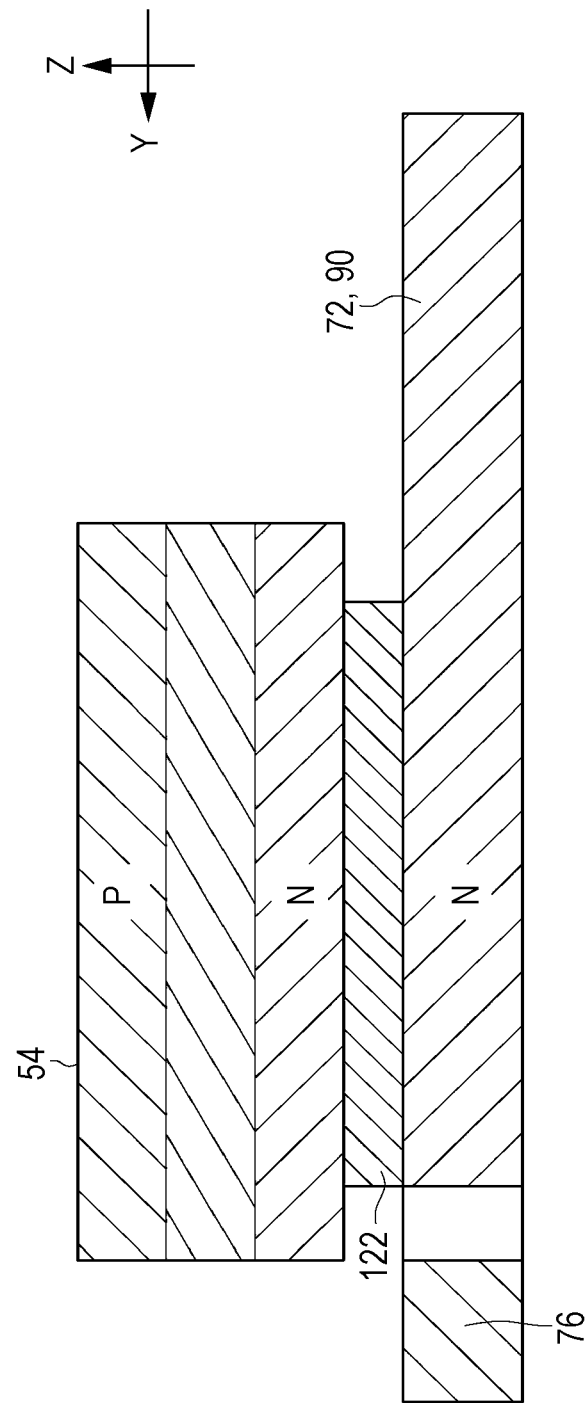
FIG. 13 is a cross-sectional view taken along a line XIII-XIII of FIG. 11.

FIG. 11 is a plan view of the first lower plate portion 90 and the lower gate line 76 and its vicinity (a gate lead-out portion) with the lower SW element 54 being see-through (also refer to FIG. 2). FIG. 12 is a cross-sectional view taken along a line XII-XII of FIG. 11. FIG. 13 is a cross-sectional view taken along a line XIII-XIII of FIG. 11. As illustrated in FIGS. 11 to 13, when a switching element illustrated in FIG. 10 is used as the lower SW element 54, a convex portion 120 can be formed on the lower gate line 76 so as to correspond to the gate electrode 68. As illustrated in FIG. 12, the convex portion 120 is joined to the gate electrode 68 using solder paste 122. The first lower plate portion 90 of the negative terminal 72 is joined to the negative electrode 66 using the solder paste 122.

When viewed in the layer direction of the arm series circuit 30 (in the Z direction in FIG. 12), in the lower gate line 76 illustrated in FIGS. 11 to 13, only the convex portion 120 overlaps the lower SW element 54. The other portion does not overlap the lower SW element 54 (refer to FIG. 11). By providing the convex portion 120 in this manner, the gate electrode 68 can be easily joined to the lower gate line 76 even when the gate electrode 68 is surrounded by the negative electrodes 66 on the second surface 64 in three directions.

Alternatively, a structure that is similar to the structure illustrated in FIG. 10 can be achieved using a combination of the positive electrodes 62 and the gate electrode 68. That is, the negative electrodes 66 illustrated in FIG. 10 may be replaced with the positive electrodes 62 (also refer to FIG. 8). In such a case, as in FIGS. 11 to 13, the convex portion 120 is provided on the upper gate line 74, and the convex portion 120 is joined to the gate electrode 68 using the solder paste 122. In addition, the first upper plate portion 84 of the positive terminal 70 is joined to the positive electrodes 62 using the solder paste 122. In this way, the gate electrode 68 on the first surface 60 can be easily joined to the upper gate line 74 even when the gate electrode 68 is surrounded by the positive electrodes 62 in three directions.

In addition to the case in which the gate electrode 68 is surrounded by the positive electrodes 62 or the negative electrodes 66 in three directions, the structure having the convex portion 120 is applicable to the case in which the gate electrode 68 is formed between the positive electrodes 62 or the negative electrodes 66 in only two directions (e.g., in the right and left directions in FIG. 10). In addition, the structure having the convex portion 120 is applicable to the case in which the gate electrode 68 is disposed at a corner of the first surface 60 or at a corner of the second surface 64 (e.g., at the upper right corner or at the upper left corner in FIG. 10).

Figure 14:
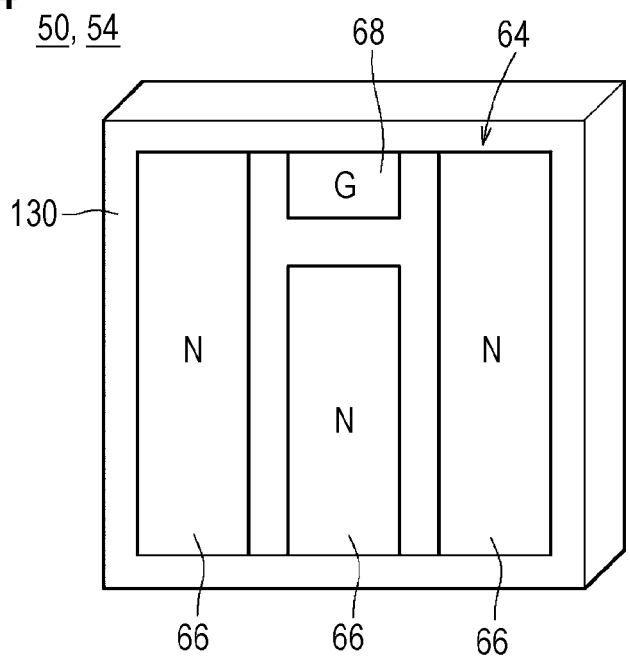
FIG. 14 is a schematic outline view of a second surface of a switching element according to a fourth modification.

Alternatively, as illustrated in FIG. 14, the switching elements (the upper SW elements 50 and the lower SW elements 54) may have a structure in which the negative electrodes 66 surround the gate electrode 68 on the second surface 64 in three directions and a guard ring 130 is formed along the outer edge of the second surface 64. In such a case, the first surface 60 is similar to that in FIG. 4A. The guard ring 130 is formed as a ring pattern that blocks a leakage current flowing from the negative electrodes 66 and the gate electrode 68.

Figure 15:
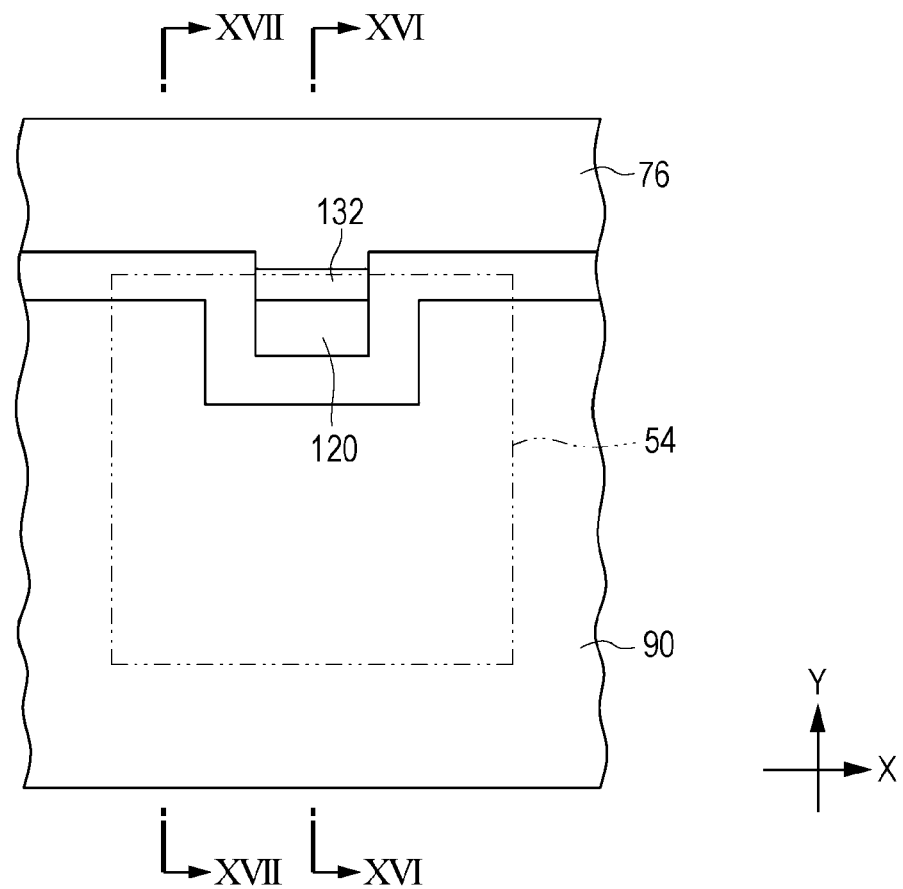

FIG. 15 illustrates the first lower plate portion 90 and the lower gate line 76 and its vicinity (a gate lead-out portion) with the lower SW element 54 being see-through (also refer to FIG. 2). FIG. 16 is a cross-sectional view taken along a line XVI-XVI of FIG. 15. FIG. 17 is a cross-sectional view taken along a line XVII-XVII of FIG. 15. As illustrated in FIGS. 15 and 16, when a switching element illustrated in FIG. 14 is used as the lower SW element 54, a convex portion 120 can be formed on the lower gate line 76 so as to correspond to the gate electrode 68. In addition, a groove portion 132 is formed in the lower gate line 76 so as to correspond to the guard ring 130. As illustrated in FIG. 16, the convex portion 120 is joined to the gate electrode 68 using solder paste 122. The first lower plate portion 90 of the negative terminal 72 is joined to the negative electrodes 66 using the solder paste 122. In addition, the groove portion 132 is formed immediately under the guard ring 130.

The convex portion 120 of the lower gate line 76 illustrated in FIGS. 15 and 16 can provide an operation and an advantage that are the same as the operation and advantage described referring to FIGS. 11 to 13. In addition, since the groove portion 132 is provided, it is difficult to place the solder paste 122 at the position of the groove portion 132. Alternatively, the height of a portion of the solder paste 122 placed in the groove portion 132 is smaller than the height of the other portion of the solder paste 122. Accordingly, the guard ring 130 may be not in contact with the solder paste 122. Furthermore, when the lower SW element 54 is placed, the guard ring 130 may be not in contact with the lower gate line 76. For example, when, in FIG. 16, the lower SW element 54 is placed from above with the lower SW element 54 inclined (with, in FIG. 16, the left side of the lower SW element 54 inclined downward) and if the groove portion 132 is not provided, the guard ring 130 provided along the outer edge of the lower SW element 54 is readily in contact with the lower gate line 76. However, the groove portion 132 can prevent such contact. In this way, damage of the guard ring 130 can be avoided. If the guard ring 130 is damaged, the amount of a leakage current increases. Accordingly, by protecting the guard ring 130 from being damaged, an increase in the amount of a leakage current can be prevented.

C. Output Terminal and Insulating Pole

While the above exemplary embodiment has been described with reference to the prismatic insulating poles 102 used as an insulating member that separates the output terminal 78 from the ground GND, any insulating member that has a convex shape and that separates the output terminal 78 from the insulating substrate 80 and the ground GND (the heat sink 82) can be employed. For example, instead of employing the insulating poles 102, an insulating member having a columnar shape, a frustum shape, or a barrel shape can be employed.

While the above exemplary embodiment has been described with reference to two insulating poles 102 that separate the output terminal 78 from the insulating substrate 80 and the ground GND (the heat sink 82), one or three or more members that separate the output terminal 78 from the insulating substrate 80 and the ground GND (the heat sink 82) may be employed.

D. Others

While the above exemplary embodiment has been described with reference to a combination of the structure in which the lower gate electrode 68low is directly joined to the lower gate line 76 and the structure in which the insulating poles 102 are provided, only one of the structures can be employed.

According to an embodiment of the present technology, a semiconductor device includes at least one arm series circuit including an upper arm and a lower arm connected to the upper arm in series, each of the upper arm and the lower arm including a switching element and a diode connected in anti-parallel to the switching element. The arm series circuit includes a positive terminal, a negative terminal, an upper arm control terminal, and a lower arm control terminal that are formed on an insulating substrate disposed on ground, the negative terminal being disposed so as to be adjacent to the lower arm control terminal. The arm series circuit includes an output terminal disposed above the insulating substrate with an insulating member formed on the insulating substrate and having a convex shape disposed therebetween. The switching element of each of the upper arm and the lower arm has a positive electrode formed on a first surface of the switching element and a negative electrode and a control electrode formed on a second surface opposite the first surface. The positive electrode of the switching element of the upper arm is joined to the positive terminal of the arm series circuit without using an interconnection line. The negative electrode of the switching element of the upper arm is connected to the output terminal of the arm series circuit using a negative-side interconnection line. The control electrode of the switching element of the upper arm is connected to the upper arm control terminal of the arm series circuit using a control interconnection line. The negative electrode of the switching element of the lower arm is joined to the negative terminal of the arm series circuit without using an interconnection line. The positive electrode of the switching element of the lower arm is connected to the output terminal of the arm series circuit using a positive-side interconnection line. The control electrode of the switching element of the lower arm is joined to the lower arm control terminal of the arm series circuit without using an interconnection line.

According to the embodiment, conducted noise and radiation noise caused by a common mode current can be reduced. In addition, the control electrode of the switching element of the lower arm can be easily connected to the lower arm control terminal of the arm series circuit.

That is, according to the embodiment, since the output terminal of the arm series circuit is disposed above the insulating substrate with the insulating member formed on the insulating substrate and having a convex shape disposed therebetween, the output terminal can be separated from the insulating substrate and the ground by the height of the insulating member. Accordingly, a floating capacitance generated between the output terminal and the ground can be reduced. In this way, the impedance between the output terminal at which a voltage variation is relatively significant and the ground can be increased. Thus, the amount of electrical current that flows between the output terminal and the ground due to a variation in the voltage can be reduced. Accordingly, the common mode current that flows toward the power supply or the output side can be reduced. As a result, conducted noise and radiation noise caused by the common mode current can be reduced.

In addition, according to the embodiment, the control electrode of the switching element of the lower arm is joined to the lower arm control terminal of the arm series circuit without using an interconnection line. Accordingly, the control electrode is formed on the same side as the negative electrode (on the second surface). Thus, even when the negative electrode is joined to the negative terminal of the arm series circuit without using an interconnection line (e.g., a bonding wire or a bus bar), the control electrode can be easily connected to the lower arm control terminal.

The lower arm control terminal may have a convex portion that protrudes so as to correspond to the control electrode of the switching element of the lower arm and, when viewed in a layer direction of the arm series circuit, only the convex portion of the lower arm control terminal may overlap the switching element of the lower arm. In this way, when the control electrode of the switching element of the lower arm is formed at a position between the negative electrodes in two opposite directions or when the control electrode is surrounded by the negative electrodes in three directions, the control electrode can be easily connected to the lower arm control terminal.

According to another embodiment of the present technology, a semiconductor device includes at least one arm series circuit including an upper arm and a lower arm connected to the upper arm in series, each of the upper arm and the lower arm including a switching element and a diode connected in anti-parallel to the switching element. The arm series circuit includes a positive terminal, a negative terminal, an upper arm control terminal, and a lower arm control terminal that are formed on an insulating substrate disposed on ground, the positive terminal being disposed so as to be adjacent to the upper arm control terminal. The arm series circuit includes an output terminal disposed above the insulating substrate with an insulating member formed on the insulating substrate and having a convex shape disposed therebetween. The switching element of each of the upper arm and the lower arm has a positive electrode and a control electrode formed on a first surface of the switching element and a negative electrode formed on a second surface opposite the first surface. The positive electrode of the switching element of the upper arm is joined to the positive terminal of the arm series circuit without using an interconnection line. The negative electrode of the switching element of the upper arm is connected to the output terminal of the arm series circuit using a negative-side interconnection line. The control electrode of the switching element of the upper arm is joined to the upper arm control terminal of the arm series circuit without using an interconnection line. The negative electrode of the switching element of the lower arm is joined to the negative terminal of the arm series circuit without using an interconnection line. The positive electrode of the switching element of the lower arm is connected to the output terminal of the arm series circuit using a positive-side interconnection line. The control electrode of the switching element of the lower arm is connected to the lower arm control terminal of the arm series circuit using a control interconnection line.

According to the embodiment, conducted noise and radiation noise caused by a common mode current can be reduced. In addition, the control electrode of the switching element of the upper arm can be easily connected to the upper arm control terminal of the arm series circuit.

That is, according to the embodiment, since the output terminal of the arm series circuit is disposed above the insulating substrate with the insulating member formed on the insulating substrate and having a convex shape disposed therebetween, the output terminal can be separated from the insulating substrate and the ground by the height of the insulating member. Accordingly, a floating capacitance generated between the output terminal and the ground can be reduced. In this way, the impedance between the output terminal at which a voltage variation is relatively significant and the ground can be increased. Thus, the amount of electrical current that flows between the output terminal and the ground due to a variation in the voltage can be reduced. Accordingly, the common mode current that flows toward the power supply or the output side can be reduced. As a result, conducted noise and radiation noise caused by the common mode current can be reduced.

In addition, according to the embodiment, the control electrode of the switching element of the upper arm is joined to the upper arm control terminal of the arm series circuit without using an interconnection line. Accordingly, the control electrode is formed on the same side as the positive electrode (on the first surface). Thus, even when the positive electrode is joined to the positive terminal of the arm series circuit without using an interconnection line, the control electrode can be easily connected to the upper arm control terminal.

The upper arm control terminal may have a convex portion that protrudes so as to correspond to the control electrode of the switching element of the upper arm and, when viewed in a layer direction of the arm series circuit, only the convex portion of the upper arm control terminal may overlap the switching element of the upper arm. In this way, even when the control electrode of the switching element of the upper arm is formed at a position between the positive electrodes in two opposite directions or the control electrode is surrounded by the positive electrodes in three directions, the control electrode can be easily connected to the upper arm control terminal.

When viewed in a layer direction of the arm series circuit, a position of the negative electrode of the switching element of the upper arm and a position of the positive electrode of the switching element of the lower arm may be offset from a position of the output terminal. Therefore, as compared with the case in which when viewed in the layer direction, the position of the negative electrode (the upper arm negative electrode) of the switching element of the upper arm and the position of the positive electrode (the lower arm positive electrode) of the switching element of the lower arm overlap the position of the output terminal, the negative-side interconnection line can be easily provided between the upper arm negative electrode and the output terminal. In addition, the positive-side interconnection line can be easily provided between the lower arm positive electrode and the output terminal.

When viewed in a layer direction of the arm series circuit, the output terminal of the arm series circuit may be disposed at a middle point between the positive terminal and the negative terminal. In this way, the length of an interconnection line extending between the switching element of the upper arm and the output terminal may easily be the same as the length of an interconnection line extending between the switching element of the lower arm and the output terminal. Thus, a difference between the inductance components of the interconnection lines can be reduced. As a result, the occurrence of conducted noise and radiation noise can be reduced.

According to still another embodiment of the present technology, a semiconductor device includes at least one arm series circuit including an upper arm and a lower arm connected to the upper arm in series, each of the upper arm and the lower arm including a switching element and a diode connected in anti-parallel to the switching element. An insulating substrate is disposed on ground. A positive terminal, a negative terminal, an upper arm control terminal, and a lower arm control terminal of the arm series circuit are disposed on the insulating substrate. An output terminal of the arm series circuit is disposed above the insulating substrate with an insulating member formed on the insulating substrate and having a convex shape disposed therebetween.

According to the embodiments, conducted noise and radiation noise caused by a common mode current can be reduced. In addition, the control electrode of the switching element of the lower arm can be easily connected to the lower arm control terminal of the arm series circuit.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:
   at least one arm series circuit comprising:
      an upper arm;
      a lower arm connected to the upper arm in series, each of the upper arm and the lower arm including a switching element and a diode connected in anti-parallel to the switching element;
      an insulating substrate disposed on ground;
      a positive terminal provided on the insulating substrate;
      a negative terminal provided on the insulating substrate;
      an upper arm control terminal provided on the insulating substrate;
      a lower arm control terminal provided adjacent to the negative terminal on the insulating substrate;
      an output terminal disposed above the insulating substrate; and
      an insulating member having a convex shape and provided on the insulating substrate between the output terminal and the insulating substrate;
   the switching element of each of the upper arm and the lower arm having a positive electrode, a negative electrode, and a control electrode, the positive electrode being provided on a first surface of the switching element, each of the negative electrode and the control electrode being provided on a second surface of the switching element, the second surface being disposed on an opposite side of the first surface;
   the positive electrode of the switching element of the upper arm being joined to the positive terminal of the arm series circuit without using an interconnection line;
   the negative electrode of the switching element of the upper arm being connected to the output terminal of the arm series circuit using a negative-side interconnection line;
   the control electrode of the switching element of the upper arm being connected to the upper arm control terminal of the arm series circuit using a control interconnection line;
   the negative electrode of the switching element of the lower arm being joined to the negative terminal of the arm series circuit without using an interconnection line;
   the positive electrode of the switching element of the lower arm being connected to the output terminal of the arm series circuit using a positive-side interconnection line; and
   the control electrode of the switching element of the lower arm being joined to the lower arm control terminal of the arm series circuit without using an interconnection line.

2. The semiconductor device according to claim 1,
   wherein the lower arm control terminal has a convex portion that protrudes to correspond to the control electrode of the switching element of the lower arm, and
   wherein when viewed in a layer direction of the arm series circuit, only the convex portion of the lower arm control terminal overlaps the switching element of the lower arm.

3. A semiconductor device comprising:
   at least one arm series circuit comprising:
   an upper arm;
   a lower arm connected to the upper arm in series, each of the upper arm and the lower arm including a switching element and a diode connected in anti-parallel to the switching element;
   an insulating substrate disposed on ground;
   a positive terminal provided on the insulating substrate;
   a negative terminal provided on the insulating substrate;
   an upper arm control terminal provided adjacent to the positive terminal on the insulating substrate;
   a lower arm control terminal provided on the insulating substrate;
   an output terminal disposed above the insulating substrate; and
   an insulating member having a convex shape and provided on the insulating substrate between the output terminal and the insulating substrate;
   the switching element of each of the upper arm and the lower arm having a positive electrode, a control electrode, and a negative electrode, the control electrode being provided on a first surface of the switching element, the negative electrode being provided on a second surface of the switching element, the second surface being disposed on an opposite side of the first surface;
   the positive electrode of the switching element of the upper arm being joined to the positive terminal of the arm series circuit without using an interconnection line;
   the negative electrode of the switching element of the upper arm being connected to the output terminal of the arm series circuit using a negative-side interconnection line;
   the control electrode of the switching element of the upper arm being joined to the upper arm control terminal of the arm series circuit without using an interconnection line;
   the negative electrode of the switching element of the lower arm being joined to the negative terminal of the arm series circuit without using an interconnection line;
   the positive electrode of the switching element of the lower arm being connected to the output terminal of the arm series circuit using a positive-side interconnection line; and
   the control electrode of the switching element of the lower arm being connected to the lower arm control terminal of the arm series circuit using a control interconnection line.

4. The semiconductor device according to claim 3, wherein the upper arm control terminal has a convex portion that protrudes to correspond to the control electrode of the switching element of the upper arm, and
   wherein when viewed in a layer direction of the arm series circuit, only the convex portion of the upper arm control terminal overlaps the switching element of the upper arm.

5. The semiconductor device according to claim 1, wherein when viewed in a layer direction of the arm series circuit, a position of the negative electrode of the switching element of the upper arm and a position of the positive electrode of the switching element of the lower arm are offset from a position of the output terminal.

6. The semiconductor device according to claim 3, wherein when viewed in a layer direction of the arm series circuit, a position of the negative electrode of the switching element of the upper arm and a position of the positive electrode of the switching element of the lower arm are offset from a position of the output terminal.

7. The semiconductor device according to claim 1, wherein when viewed in a layer direction of the arm series circuit, the output terminal of the arm series circuit is disposed at a substantially middle point between the positive terminal and the negative terminal.

8. The semiconductor device according to claim 3, wherein when viewed in a layer direction of the arm series circuit, the output terminal of the arm series circuit is disposed at a substantially middle point between the positive terminal and the negative terminal.

9. The semiconductor device according to claim 1, wherein the output terminal is provided farther from the insulating substrate than the positive terminal and the negative terminal in a layer direction of the arm series circuit.

10. The semiconductor device according to claim 3, wherein the output terminal is provided farther from the insulating substrate than the positive terminal and the negative terminal in a layer direction of the arm series circuit.

11. A semiconductor device comprising:
    at least one arm series circuit comprising:
    an upper arm;
    a lower arm connected to the upper arm in series, each of the upper arm and the lower arm including a switching element and a diode connected in anti-parallel to the switching element;
    an insulating substrate disposed on ground;
    a positive terminal provided on the insulating substrate;
    a negative terminal provided on the insulating substrate;
    an upper arm control terminal provided on the insulating substrate;
    a lower arm control terminal provided on the insulating substrate;
    an output terminal disposed above the insulating substrate; and
    an insulating member having a convex shape and provided on the insulating substrate between the output terminal and the insulating substrate.

12. The semiconductor device according to claim 11, wherein the lower arm control terminal has a convex portion that protrudes to correspond to the control electrode of the switching element of the lower arm, and
    wherein when viewed in a layer direction of the arm series circuit, only the convex portion of the lower arm control terminal overlaps the switching element of the lower arm.

13. The semiconductor device according to claim 11, wherein the upper arm control terminal has a convex portion that protrudes to correspond to the control electrode of the switching element of the upper arm, and
    wherein when viewed in a layer direction of the arm series circuit, only the convex portion of the upper arm control terminal overlaps the switching element of the upper arm.

14. The semiconductor device according to claim 11, wherein when viewed in a layer direction of the arm series circuit, a position of the negative electrode of the switching element of the upper arm and a position of the positive electrode of the switching element of the lower arm are offset from a position of the output terminal.

15. The semiconductor device according to claim 11, wherein when viewed in a layer direction of the arm series circuit, the output terminal of the arm series circuit is disposed at a substantially middle point between the positive terminal and the negative terminal.

16. The semiconductor device according to claim 11, wherein the output terminal is provided farther from the insulating substrate than the positive terminal and the negative terminal in a layer direction of the arm series circuit.

* * * * *